(12) United States Patent
Kong et al.

(10) Patent No.: US 6,180,430 B1
(45) Date of Patent: Jan. 30, 2001

(54) METHODS TO REDUCE LIGHT LEAKAGE IN LCD-ON-SILICON DEVICES

(75) Inventors: Sik On Kong; Dai Feng; Yung-Tao Lin; Robert Chin Fu Tsai, all of Singapore (SG)

(73) Assignee: Chartered Semiconductor Manufacturing Ltd., Singapore (SG)

( * ) Notice: Under 35 U.S.C. 154(b), the term of this patent shall be extended for 0 days.

(21) Appl. No.: 09/458,726

(22) Filed: Dec. 13, 1999

(51) Int. Cl.⁷ ................................................. H01L 21/00
(52) U.S. Cl. ............................................ 438/30; 438/29
(58) Field of Search ........................... 438/30, 29, 34, 438/35, 800, 27, 28, 158

(56) References Cited

U.S. PATENT DOCUMENTS

| | | | |
|---|---|---|---|
| 4,203,792 | 5/1980 | Thompson | 156/272 |
| 5,767,827 | 6/1998 | Kobayashi et al. | 345/87 |
| 5,781,254 | 7/1998 | Kim et al. | 349/44 |
| 5,784,133 | 7/1998 | Kim et al. | 349/44 |
| 5,850,271 | 12/1998 | Kim et al. | 349/111 |
| 5,851,411 | 12/1998 | An et al. | 216/23 |
| 5,854,663 | 12/1998 | Oh et al. | 349/42 |
| 5,926,702 | * 7/1999 | Kwon et al. | 438/158 |

* cited by examiner

*Primary Examiner*—Charles Bowers
*Assistant Examiner*—Craig Thompson
(74) *Attorney, Agent, or Firm*—George O. Saile; Rosemary L.S. Pike; Stephen G. Stanton (57) ABSTRACT

A method of fabricating an LCD-on-silicon device, comprising the following steps. A semiconductor structure having a control transistor formed therein is provided. The control transistor having a source and a drain. An interlevel dielectric (ILD) layer over the semiconductor structure is provided. Source/drain (S/D) plugs contacting the source and drain through contact openings in said ILD layer are provided. M1 lines are formed over the ILD layer and connected to at least the S/D plugs. An M1 intermetal dielectric (IMD) layer is deposited and patterned over the M1 lines to form M1 contact openings exposing at least some of the M1 metal lines. M1 metal plugs are formed within the M1 contact openings and M2 metal islands connected to, and integral with, at least the M1 metal plugs. The M2 metal islands having exposed side walls. Sidewall spacers are formed on the exposed M2 metal islands side walls. A second M2 metallization layer is deposited and patterned over the M2 metal islands to form a shielding layer adjacent to and contiguous with the sidewall spacers. The M2 metal islands, sidewall spacers, and shielding layer form a light shielding layer. At least one additional dielectric and conductive layer is formed over the light shielding layer and the M1 intermetal dielectric (IMD) layer. LCD pixels are then formed thereover.

24 Claims, 7 Drawing Sheets

METHODS TO REDUCE LIGHT LEAKAGE IN LCD-ON-SILICON DEVICES

FIELD OF THE INVENTION

The present invention relates generally to LCD semiconductor devices, and more specifically to reflective type LCD-on-silicon semiconductor devices.

BACKGROUND OF THE INVENTION

LCD-on-silicon devices, or reflective type display LCD devices, need to be illuminated with high intensity light. Stray light leaking through the gaps between metal lines/pixels may cause the bottom, or control, transistors to malfunction by the photoelectric effect. This phenomenon limits the brightness of the projected image to lessen the risk/effects of the photoelectric effect on the bottom transistors.

U.S. Pat. No. 5,767,827 to Kobayashi et al. describes a passivation film CMP polishing method used in the fabrication of reflective type active matrix LCD display panels.

U.S. Pat. No. 4,203,792 to Thompson describes a method of fabricating a dome shaped transparent polymer material within which is an opto-isolator, or optically coupled isolator. The method provides for an initial gelling of the multicomponent polymer material so that the desired dome shape may be retained while a heat cure is performed. An opaque body of polymer, adapted for diffusely reflecting light, can be used to enclose the dome shaped transparent polymer material.

U.S. Pat. No. 5,926,702 to Kwon et al. describes a method of fabricating a TFT (thin film transistor) array substrate having a black matrix (light shielding layer) to generally shield the TFT, data bus line and gate bus line of the lower substrate of an LCD (liquid crystal display) to prevent light leakage. A transparent planarization layer is used to reduce the step height near the boundaries of the black matrix resin and the pixel electrode (overlying the transparent planarization layer). This reduces the poor rubbing problem otherwise present near the boundaries between the black matrix and the pixel electrode.

U.S. Pat. No. 5,854,663 to Oh et al. describes a liquid crystal display (LCD) and a method of making same where a black matrix region is formed over a orientation layer that is evenly formed on the surface of the TFT panel. The orientation layer is formed and rubbed to form regular microgrooves on its surface which serve to align liquid crystal molecules for selectively transmitting light. The black matrix is then formed over the rubbed orientation layer so that the orientation of the liquid crystal molecules within 1 to 2 μm around the black matrix region is substantially carried out thus increasing the contrast ratio and enhancing picture quality.

U.S. Pat. No. 5,851,411 to An et al. describes a method of manufacturing an LCD display that includes first and second substrates each having an inner light shielding region and an edge light shielding region. The inner light shielding and an edge light shielding regions are both formed of a black matrix.

U.S. Pat. No. 5,850,271 to Kim et al. describes a color filter substrate for an LCD device that is obtained by patterning color filters on a transparent substrate, selective-coating an overcoat layer on the substrate, and forming a common electrode and a black matrix to be connected to each other without any further steps. The black matrix is comprised of an opaque metal such as aluminum (Al) or chromium (Cr).

U.S. Pat. Nos. 5,781,254 and 5,784,133, both to Kim et al., describe an LCD, and a method of making same, respectively, having a top plate and a bottom plate. The bottom plate includes a plurality of gate bus lines and drain bus lines arranged in a matrix on a substrate surface with a plurality of TFTs formed at the intersections of the gate and drain bus lines. A black matrix pattern, including a non-conductive black resin, is provided on the gate and drain bus lines and the TFTs for shielding them from light generated by back lighting the display. A protective layer is formed on the black matrix pattern having contact holes for coupling the pixel electrodes to corresponding drain electrodes of the TFTs.

SUMMARY OF THE INVENTION

Accordingly, it is an object of the present invention to provide reflective type LCD-on-silicon device and a method of fabricating the same that permits increased light intensity to fall on the device.

Another object of the present invention to provide reflective type LCD-on-silicon device and a method of fabricating the same that allows for a brighter image.

A further object of the present invention to provide reflective type LCD-on-silicon device and a method of fabricating the same that allows for a increased maximum size of the projected image.

Yet another object of the present invention to provide reflective type LCD-on-silicon device and a method of fabricating the same that includes a light and signal shielding layer that protects the bottom, or control, transistors from stray light.

Other objects will appear hereinafter.

It has now been discovered that the above and other objects of the present invention may be accomplished in the following manner. Specifically, a semiconductor structure having a control transistor formed therein is provided. The control transistor having a source and a drain. An interlevel dielectric (ILD) layer is deposited and patterned over the semiconductor structure to form S/D contact openings exposing the source and drain of the control transistor. S/D metal plugs are formed within the S/D contact openings. The S/D metal plugs being comprised of a first metal. M1 metal lines are formed over the ILD layer and are connected to at least the S/D metal plugs. The M1 metal lines being comprised of the first metal. A M1 intermetal dielectric (IMD) layer is deposited and patterned over the M1 metal lines to form M1 contact openings exposing at least some of the M1 metal lines. A first M2 metallization layer is deposited, etched and planarized over the M1 IMD layer, filling the M1 contact openings, and forming M1 metal plugs within the M1 contact openings and M2 metal islands connected to, and integral with, at least the M1 metal plugs. The M2 metal islands have exposed side walls. Sidewall spacers are formed on the exposed M2 metal island side walls. A second M2 metallization layer is deposited and planarized over said the M2 metallization layer to form M2 metal lines adjacent to and contiguous with the sidewall spacers of the M2 metal islands. The M2 metal islands, M2 metal island sidewall spacers, and M2 metal lines form a light shielding layer. The M1 metal plugs, M2 metal islands, and M2 metal lines are comprised of a second metal. At least one additional IMD layer is deposited and patterned over the light shielding layer to form light shielding layer contact openings exposing at least some of the light shielding layer metal islands or lines. Light shielding layer metal plugs are formed in the light shielding layer contact openings. Pixels electrodes are formed over the at least one additional IMD layer and are connected to the light shielding layer metal plugs. An optical interface layer is formed over the pixel electrodes. The M1 IMD layer and at least one additional IMD layer may comprise black dielectric.

BRIEF DESCRIPTION OF THE DRAWINGS

The features and advantages of the method of forming an LCD-on-silicon semiconductor device according to the present invention will be more clearly understood from the following description taken in conjunction with the accompanying drawings in which like reference numerals designate similar or corresponding elements, regions and portions and in which:

FIGS. 2 through 6 schematically illustrate in cross-sectional representation formation of the preferred embodiment of the present invention.

DETAILED DESCRIPTION OF THE PREFERRED EMBODIMENT

Problem solved by the invention

Figure 1:
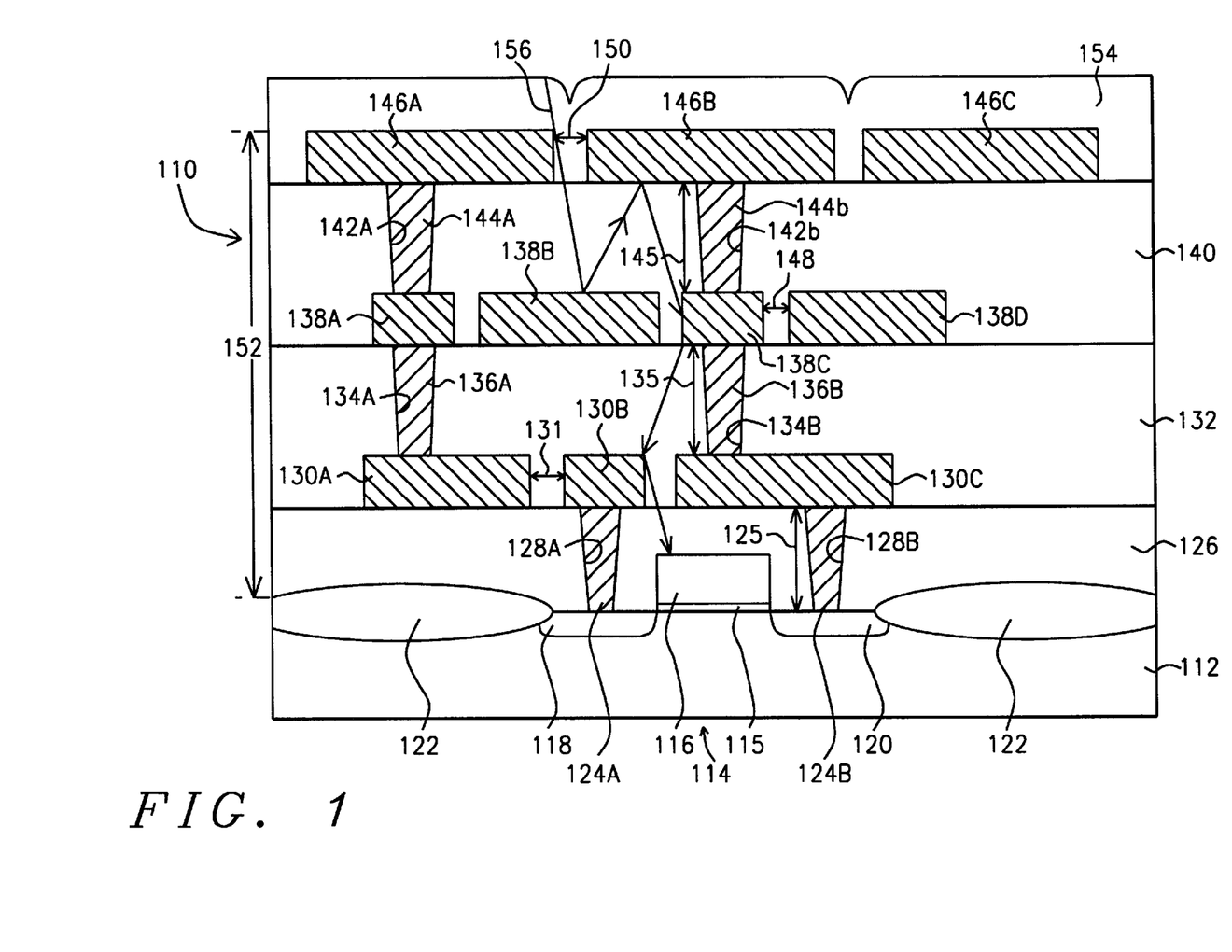
FIG. 1 schematically illustrates in cross-sectional representation a conventional LCD-on-silicon semiconductor device known to the inventors.

An original configuration LCD-on-silicon device 110 known by the inventors (not to be considered as prior art and not the invention) is shown in FIG. 1. Semiconductor structure 112 has control transistor 114 formed therein. Control transistor 114 includes gate conductor 116 with underlying gate oxide 115, source 118 and drain 120. Shallow trench isolation (STI) regions 122 isolate control transistor 114 from adjacent semiconductor devices (not shown).

Tungsten (W) S/D plugs 124A, 124B are formed within S/D contact openings 128A, 124B, respectively, within interlevel dielectric (ILD) layer 126 and connect to source 118 and drain 120, respectively, of control transistor 114. W S/D plugs 124A, 124B are about 0.5 μm high as at 125 for example. ILD layer 126 may be comprised of $SiO_2$, $Si3N_4$, organic polymers, aluminum (Al) or aluminum copper silicon alloys (AlCuSi).

Aluminum copper alloy (AlCu) M1 metal lines 130A, 130B, and 130C are formed over ILD layer 126. For example, as shown in FIG. 1, M1 metal line 130B contacts source W plug 124A and is a data signal line; and M1 metal line 130C contacts drain W plug 124B.

M1 metal lines 130A, 130B, and 130C are about 0.5 μm thick and are spaced apart by about 0.5 μm as at 131 for example.

M1 intermetal dielectric (IMD) layer 132 is formed and patterned over AlCu M1 metal lines 130A, 130B, 130C with M1 contact openings 134A, 134B exposing M1 metal lines 130A and 130C, respectively. M1 W plugs 136A, 136B are formed within M1 contact openings 134A, 134B, respectively, contacting M1 metal lines 130A and 130C, respectively. M1 W plugs 136A, 136B are about 0.5 μm high as at 135 for example.

Aluminum copper alloy (AlCu) M2 metal lines 138A, 138B, 138C, and 130D are formed over IMD layer 132, with, for example, M2 metal lines 138A, 138C contacting M1 W plugs 136A, 136B, respectively. M2 metal lines 138A, 138B, 138C, and 130D are about 0.4 μm thick. M2 metal lines 138A, 138B, 138C, and 130D are spaced apart from each other by about 0.5 μm as at 148, for example.

M2 intermetal dielectric (IMD) layer 140 is formed and patterned over AlCu M2 metal lines 138A, 138B, 138C, and 130D with M2 contact openings 142A, 142B exposing M2 metal line 138A and 138C, respectively. M2 W plugs 144A, 144B are formed within M2 contact openings 142A, 142B, respectively, contacting M1 metal line 138A and 138C, respectively. M2 W plugs 144A, 144B are about 0.5 μm high as at 145 for example.

Aluminum copper alloy (AlCu) M3 metal lines 146A, 146B, 146C are formed over IMD layer 140 with, for example, M3 metal lines 146A, 146B contacting M2 W plugs 144A, 144B, respectively. M3 metal lines 146A, 146B, 146C may also be formed of Al or AlCuSi alloys. M3 metal lines are about 0.4 μm thick and are spaced apart from each other by about 0.6 μm as at 150 for example. M3 metal lines 146A, 146B, 146C comprise pixel electrodes.

IMD layers 132, 140 may be comprised of $SiO_2$, $Si_3N_4$, organic polymers, or low dielectric constant (K) materials with or without the addition of dye to absorb light.

The total thickness, as at 152, of the original configuration LCD-on-silicon device is about 3 μm from semiconductor structure 112 to the top of M3 metal lines 146A, 146B, 146C.

Optical interface layer 154 may consist of multiple transparent layers and is then formed over M3 metal lines 146A, 146C and pixel electrode 146B to complete the reflective type LCD-on-silicon device 110. Optical interface layer 154 may include (not shown) a planarized passivation layer over M3 metal lines/pixel electrodes 146A, 146B, 146C (M3 which acts as a mirror) A liquid crystal layer is placed on the top of an orientation film (polyimide) which is on top of optical interface layer 154.A transparent electrode is formed over the upper liquid crystal orientation film and a glass substrate is formed over the transparent electrode.

The original configuration LCD-on-silicon device 110 permits stray light to leak through from optical interface layer 154 as shown at 156, for example. Stray light 156 passes between M3 metal line 146A and pixel electrode 146B, through IMD layer 140, reflects off the top of M2 metal line 138B, the bottom of pixel electrode 146B, through the gap between M2 metal lines 138B, 138C reflecting off the side of metal line 138C. Stray light 156 then passes through IMD layer 132 and through the gap between M1 metal lines 130B, 130C, reflecting off the side of M1 metal line 130B. Stray light 156 then passes through ILD layer 126 and impinges upon the control transistor 114 causing it to malfunction due to the photoelectric effect.

Preferred Embodiment of the invention

The inventors have discovered an LCD-on-silicon reflective type device structure and method of making same that prevents any such stray light from affecting the control transistors of the pixel electrodes, thus permitting increased light intensity to fall on the LCD-on-silicon device thus increasing the brightness of the projected image or the maximum size of the projected image.

Figure 2:
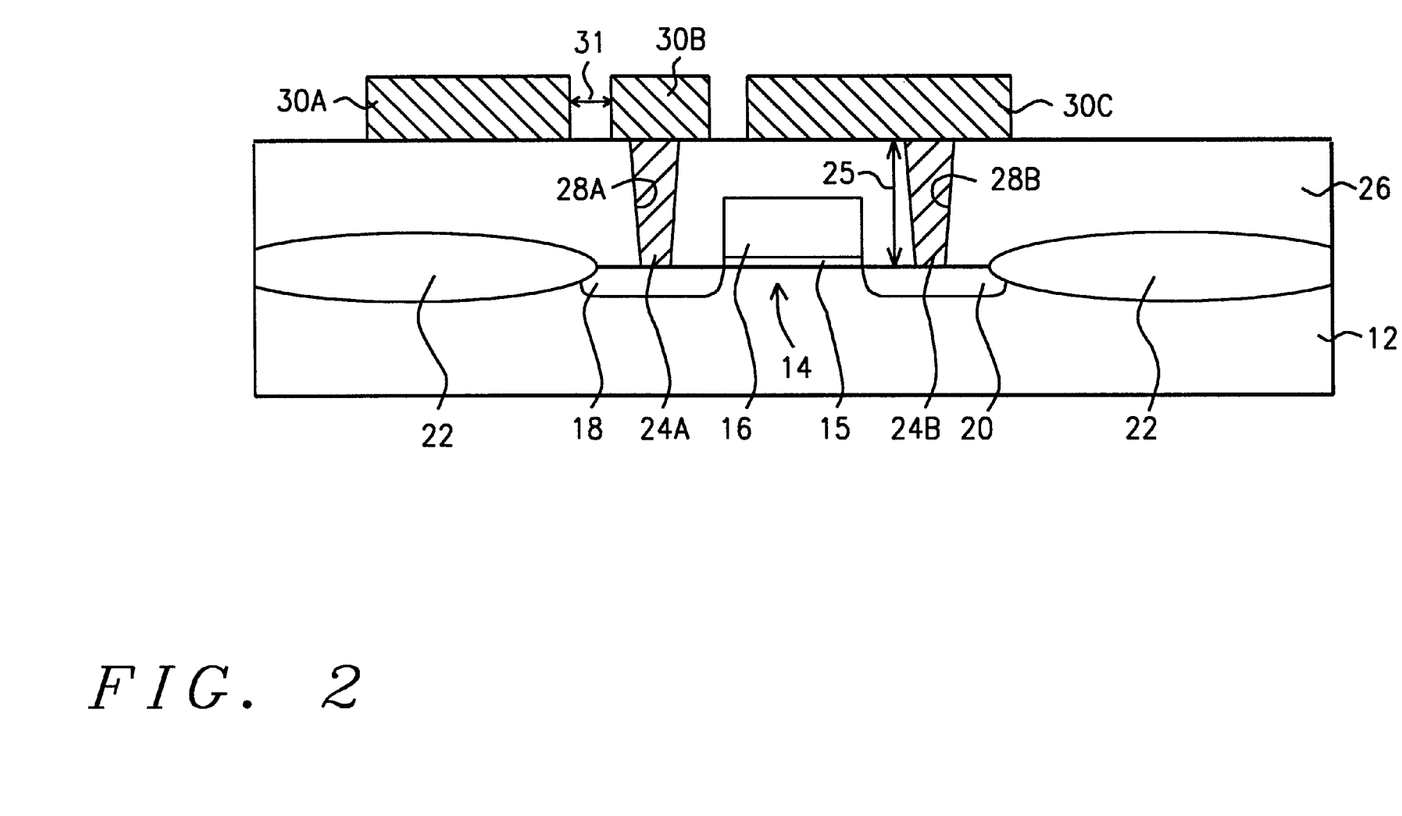

Accordingly as shown in FIG. 2, starting semiconductor structure 12 has an upper layer of silicon (Si) and is understood to possibly include a semiconductor wafer or substrate, active and passive devices formed within the wafer. The term "semiconductor structure" is meant to include devices formed within a semiconductor wafer and the layers overlying the wafer. Unless otherwise specified, all structures, layers, etc. may be formed or accomplished by conventional methods known in the prior art.

Control transistor 14 is formed within semiconductor structure 12. Control transistor 14 includes gate conductor 16 with underlying gate oxide 15, source 18 and drain 20.

Field oxide (FOX) regions 22 isolate control transistor 14 from adjacent semiconductor devices (not shown).

Interlevel dielectric (ILD) layer 26 is formed and patterned over semiconductor structure 12 and control transistor 14 to form S/D contact openings 28A, 28B, respectively. ILD layer 26 may be comprised of $SiO_2$, $Si_3N_4$, organic polymers or low K material with or without the addition of dye to absorb light.

A layer of metal, such as aluminum (Al), copper (Cu), or aluminum copper alloys (AlCu) and most preferably tungsten (W), is deposited and planarized over ILD layer 26, filling S/D contact openings 28A, 28B and forming W S/D plugs 24A, 24B, respectively. W S/D plugs 24A, 24B are about 0.5 $\mu$m high and contact source 18 and drain 20, respectively, of control transistor 14. A similar W plug (not shown) is used to contact gate 16 of control transistor 14.

A layer of another metal, such as copper, tungsten, aluminum, or titanium (Ti), and most preferably an aluminum copper alloy (AlCu) is deposited and patterned over ILD layer 26 to form M1 metal lines 30A, 30B, and 30C. For example, as shown in FIG. 2, M1 metal line 30B contacts W source plug 24A and is a data signal line; and M1 metal line 30C contacts W drain plug 24B.

M1 metal lines 30A, 30B, and 30C are about 0.4 $\mu$m thick and are spaced apart by about 0.5 $\mu$m as at 31 for example.

Figure 3:
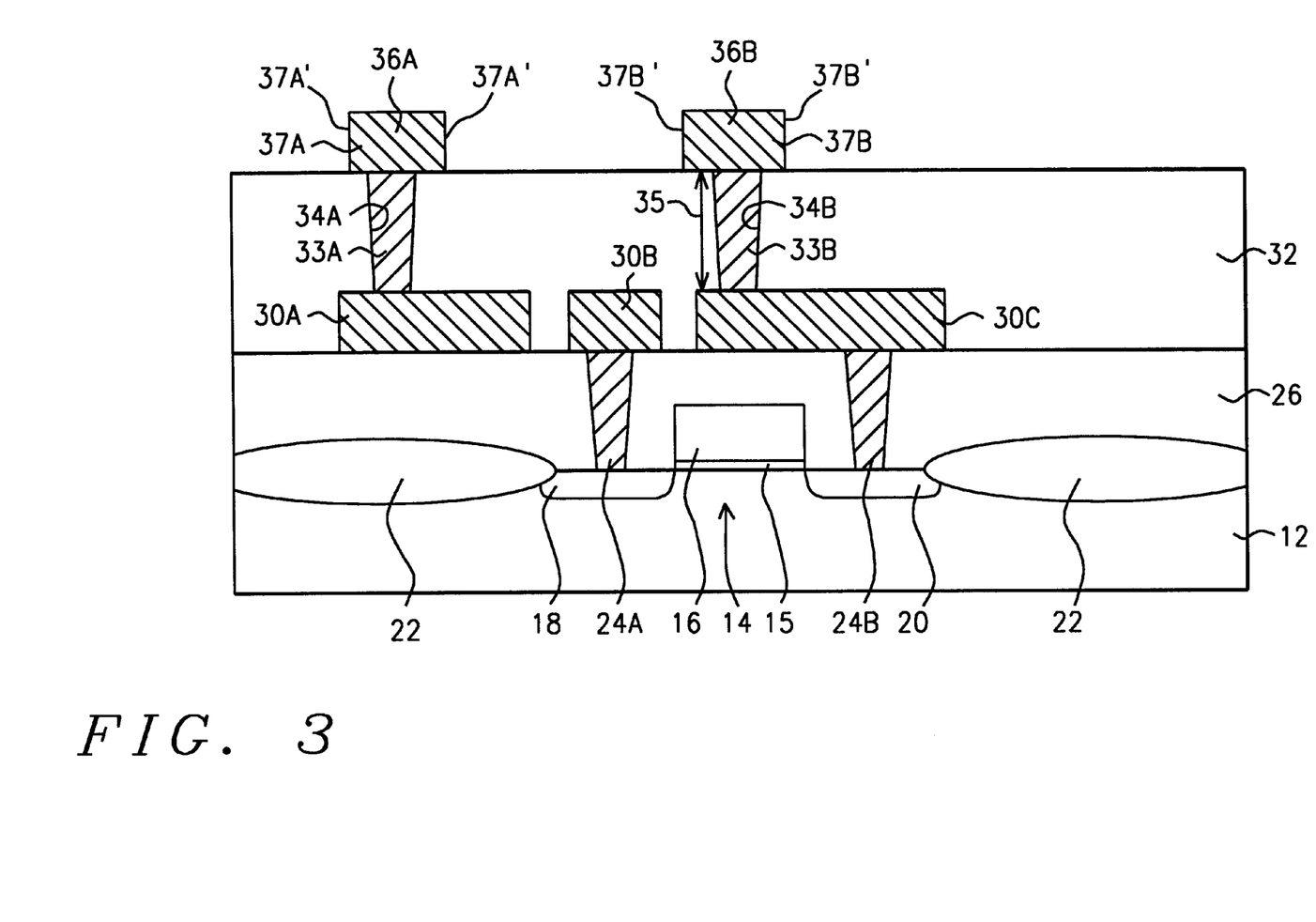

As shown in FIG. 3, M1 intermetal dielectric (IMD) layer 32 is formed and patterned over AlCu M1 metal lines 30A, 30B, 30C with M1 contact openings 34A, 34B exposing M1 metal lines 30A and 30C, respectively.

M1 IMD layer 32 may be comprised of $SiO_2$ or black dielectric which is $SiO_2$ with a black dye.

A layer of metal, such as Al, Ti, Cu or titanium nitride (TiN), and most preferably tungsten (W), is deposited, patterned and planarized over M1 IMD layer 32, filling M1 contact openings 34A, 34B and forming W plugs 33A, 33B. Another layer of W is then deposited, photomasked (for example), and etched over dielectric layer 32 to form M2 islands (e.g., lines) 37A, 37B (and optionally M2 island 37C which is likewise electrically connected to a lower device (not shown)). W plugs 33A, 33B contact M1 metal lines 30A and 30C, respectively.

W plugs 33A, 33B have a height of about 0.5 $\mu$m as at 35, for example, and M2 W metal islands 37A, 37B (and optionally 37C) have a thickness of about 0.7 $\mu$m. Together, W metal plugs 33A, 33B and W metal islands 37A, 37B (37C) form structures 36A, 36B, (37B (not completely shown)) respectively.

W M2 metal islands 37A, 37B (37C) have exposed side walls 37A', 37B', (37C') respectively.

Figure 4:
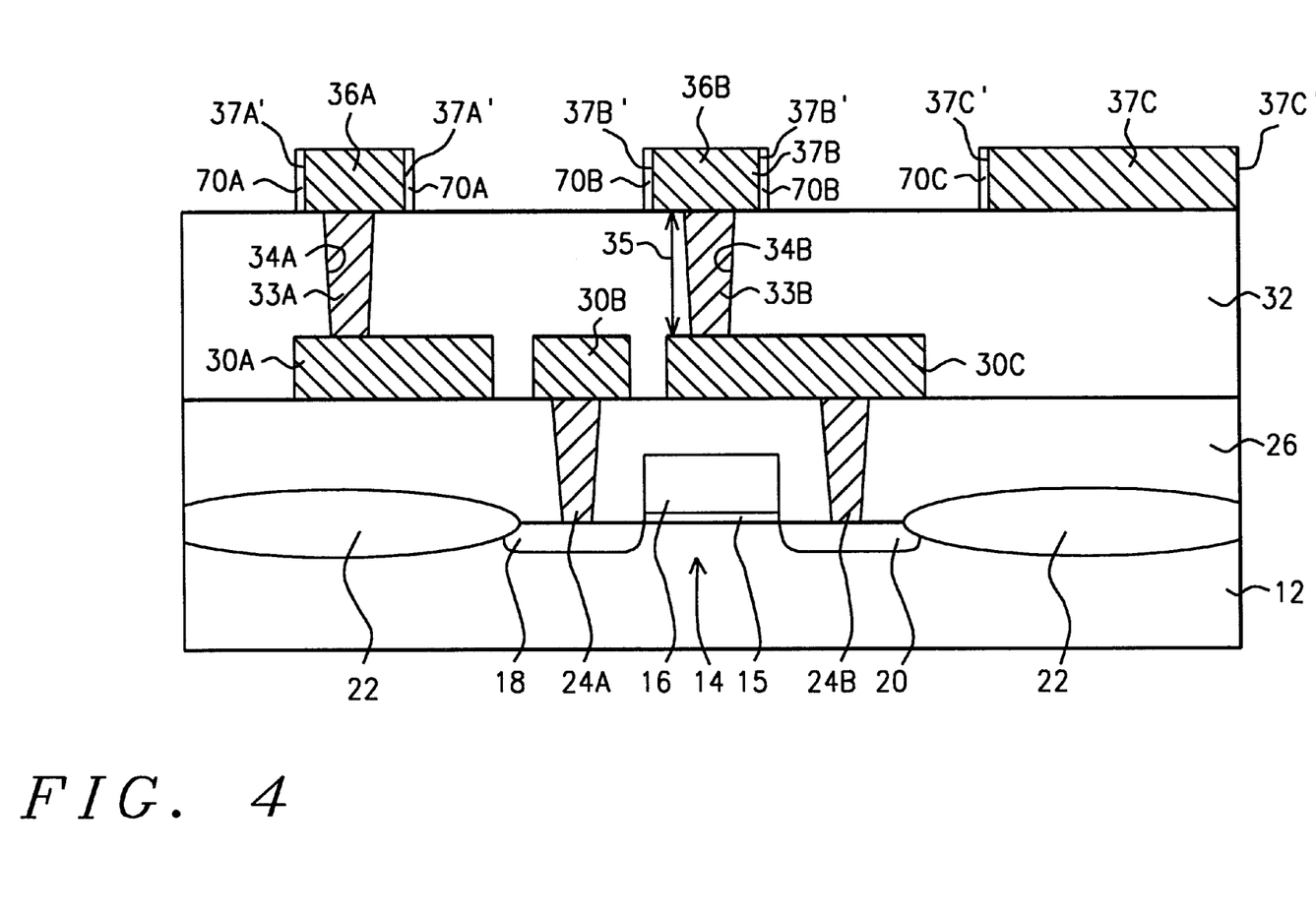

As shown in FIG. 4, preferably a black dielectric layer (not shown) is formed over ILD layer 32 and M2 metal lines 37A, 37B. The black (e.g., opaque) dielectric layer is etched to form black dielectric sidewall spacers 70A, 70B on exposed side walls 37A', 37B' of M2 metal islands 37A, 37B, respectively. Black dielectric sidewall spacers 70A, 70B are preferably from about 0.05 to 0.2 $\mu$m wide, and more preferably about 0.1 $\mu$m wide. Alternately, sidewall spacers 70A, 70B may be formed of a transparent material, such as $SiO_2$, for example.

Figure 5:
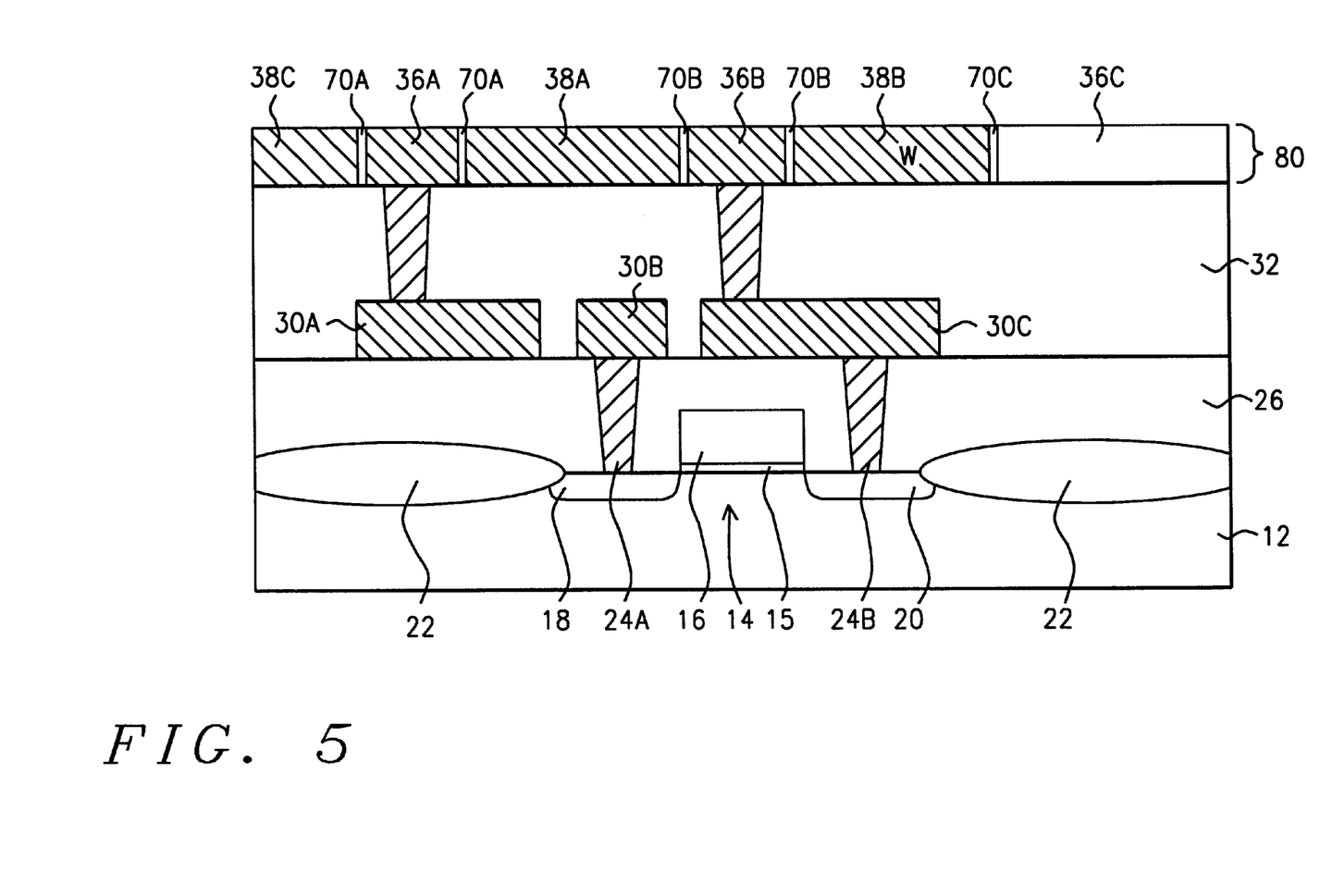
FIG. 5 is a view of FIG. 7 taken along line 5, 5.
Figure 7:
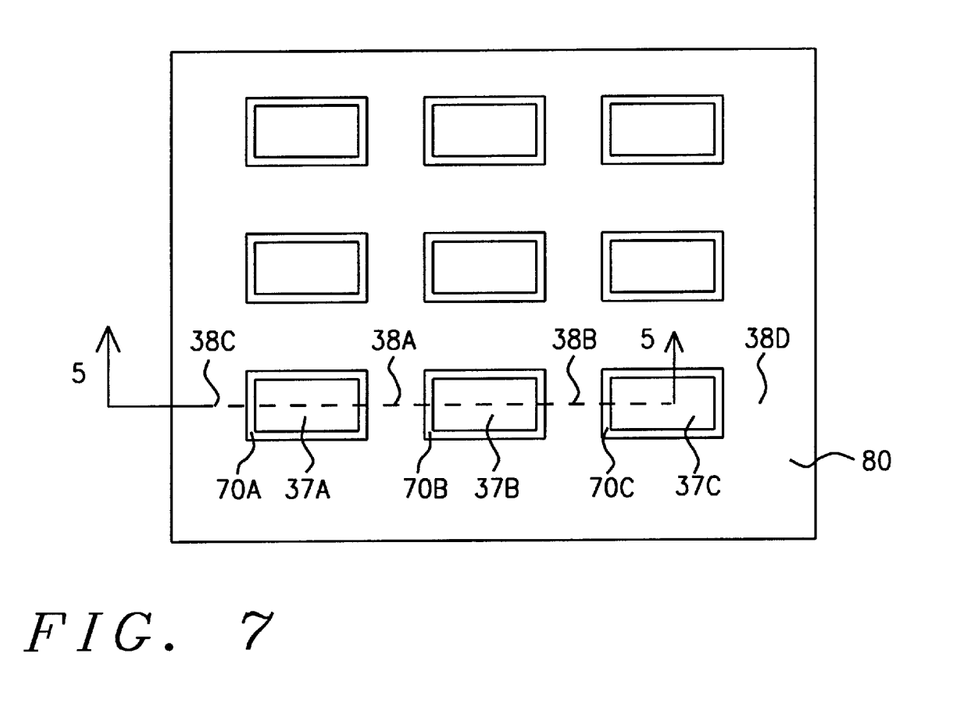
FIG. 7 is top plan view of FIG. 5.

As shown in FIGS. 5 and 7 (a top plan view of FIG. 5), in a key step, "addition metal shielding layer" 80 is formed between spacers 70A, 70B (as at 38A), and outboard of spacers 70A, 70B (as at 38C, 38B, respectively). Portion 38B may extend to the right of FIG. 5 et al. (not shown) or, as shown, a sidewall spacer 70C may be formed separating portion 38B and M2 island 36C. Metal layer 80, preferably formed of W, is deposited over M1 IMD layer 32. The metal layer may be a single sheet and can be formed of Ti, TiN and most preferably W. Single sheet metal layer 80 can be grounded. Alternately, metal shielding layer 80 may consist of separate areas connected at various potentials.

The metal layer is chemical-mechanical polished to form additional M2 portion 38A abutting black dielectric sidewall spacers 70A, 70B between upper M2 metal lines 37A, 37B of dual damascene structures 36A, 36B, respectively; and additional M2 metal portion 38B abutting the other black dielectric spacer 70B on upper M2 metal line 37B. This forms light and signal shielding layer 80 that prevents any stray light from impinging upon gate electrode 16 as will be discussed below.

Upper M2 metal islands 37A, 37B are separated from adjacent additional M2 metal lines 38A, 38B by only about from 0.05 to 0.2 $\mu$m, and more preferably about 0.1 $\mu$m—the width of black dielectric sidewall spacers 70A, 70B.

Figure 6:
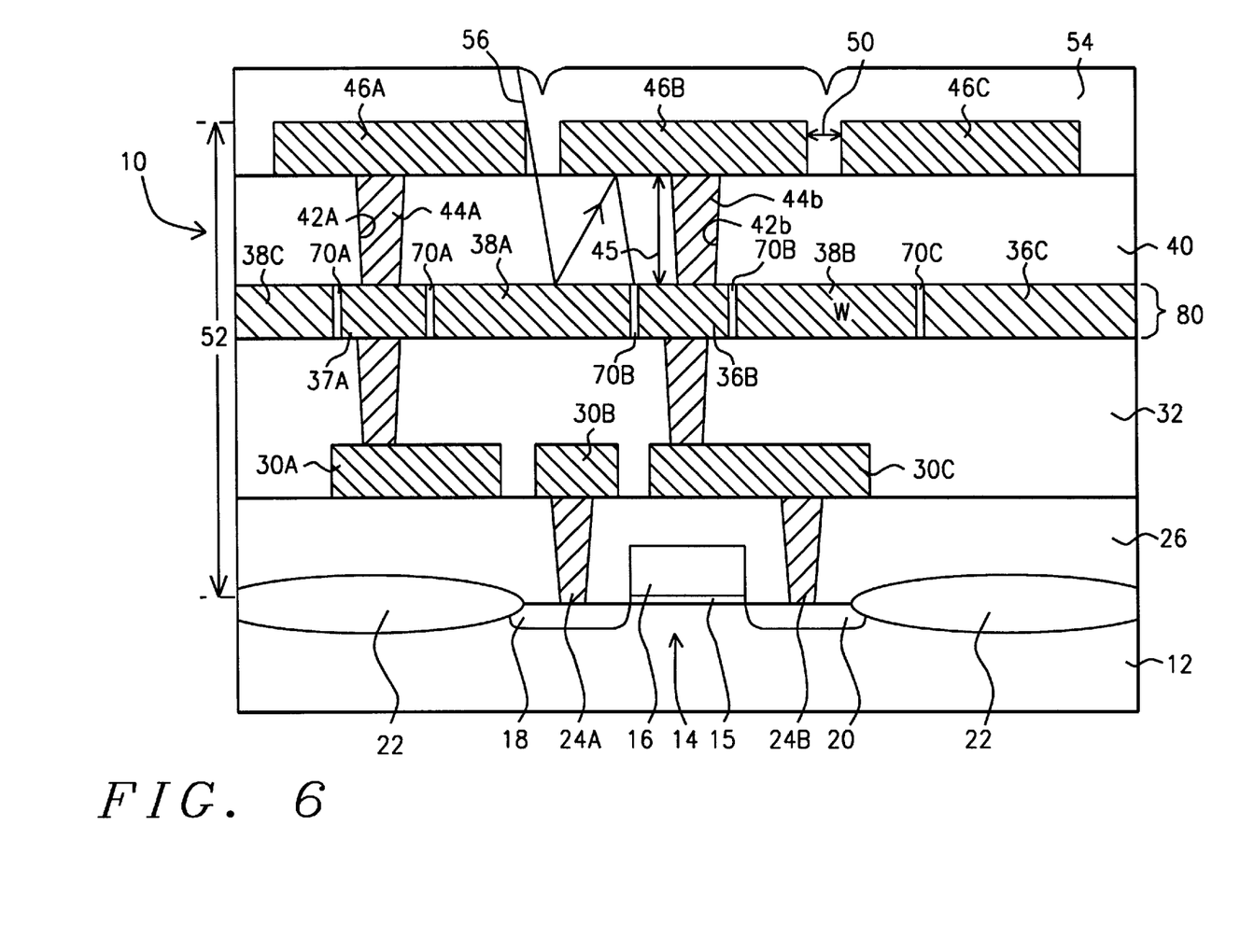

As shown in FIG. 6, M2 intermetal dielectric (IMD) layer 40 is formed and patterned over W M2 metal structures 37A, 38A, 37B, 38B to form M2 contact openings 42A, 42B exposing M2 metal islands 37A, 37B.

M2 IMD layer 40 is preferably comprised of black dielectric.

A metal layer, such as Al, aluminum silicon alloys (AlSi) or Ti, and most preferably W, is deposited and planarized over M2 IMD layer 40, filling M2 contact openings 42A, 42B and forming M2 W plugs 44A, 44B, respectively. M2 W plugs 44A, 44B are about 0.5 $\mu$m high as at 45 for example.

Another metal layer, such as Al or AlCuSi, and most preferably an aluminum copper alloy (AlCu), is deposited and patterned over M2 IMD layer 40 to form M3 metal pixels 46A, 46B, 46C. M3 metal pixels 46A, 46B, 46C are spaced apart by from about 0.5 to 0.7 $\mu$m and more preferably by 0.6 $\mu$m as at 50, for example. M3 metal pixel 46A, for example, connects to M2 W plug 44A. M3 metal pixel 46B, for example, connects to M2 W plug 44B. Pixels 46A, 46B, 46C serve as LCD electrodes as well as mirrors.

If not comprised of black dielectric, IMD layers 32, 40 may be comprised of silicon dioxide, silicon nitride, or polyimide.

The total thickness, as at 52, of the original configuration LCD-on-silicon device is from about 1 to 5 $\mu$m, and more preferably from about 2 to 3 $\mu$m, from semiconductor structure 12 to the top of M3 metal pixels 46A, 46B, 46C.

Optical interface layer 54 is then formed over M3 metal pixels 46A, 46B, 46C to complete the reflective type LCD-on-silicon device 10. Optical interface layer 54 may include (not shown) single or multiple transparent passivation layers of $SiO_2$, $Si_3N_4$, etc., over M3 pixels 46A, 46B, 146 and aids in reflection enhancement of M3 pixels 46A, 46B, 46C.

A polyimide orientation layer (not shown) is formed over optical interface layer 54. A transparent electrode (not shown) is formed over, and spaced apart from, the polyimide orientation layer. A layer of liquid crystal (not shown) is placed between the transparent electrode and the polyimide orientation layer. A glass cover (not shown) is placed over the transparent electrode.

The interconnect, metal lines and plugs described in this patent can be formed by any means and is not limited as described above. For example, the lines/plugs can also be formed using a dual damascene technique (and using an etchback of the dielectric layer to expose the sidewalls of the line) or a borderless contact process. Other methods may be used as technology advances. Also, the sidewall spacers (e.g., 70A) and the light blocking layer (e.g., 38A) can be formed on any line level and is not limited to the $2^{nd}$ metal line level.

One or more light shielding layers (line, spacer and shield layer) can be formed. Also, the invention is not limited to 3 conductive (e.g., metal) layers.

The reflective type LCD-on-silicon device 10 of the present invention does not permits stray light to leak from optical interface layer 54 as shown at 56, for example, to control transistor 14. If IMD layers 32, 40 are formed of black dielectric, most of the stray light 56 is absorbed by the black dielectric of IMD layer 40.

If IMD layers 32, 40 are not formed of black dielectric, any stray light 56, for example, passes between M3 metal lines 46A, 46B, through IMD layer 40, reflects off the top of M2 metal line 38A, then the bottom of M3 metal lines 46B. However, most of the stay light 56 may not pass through the gap between M2 metal lines 38A, 37B not only because of the narrow gap (about 0.1 μm) between those M2 metal lines, but also due to black dielectric sidewall spacer 70B between those M2 metal lines.

Control transistor 14 is protected from the photoelectric effect even if sidewall spacers 70A, 70B are formed of a transparent material, such as $SiO_2$, for example, because: black dielectric layer 40 greatly reduces the intensity of any stray light 56; and the gaps between M2 structures 36A, 38A; 38A, 37B; and 37B, 38B, respectively, are much narrower than in the conventional structures/methods without using advanced photolithography techniques, which further reduces any stray light 56 from penetrating to control transistor 14. The smaller gap formation are due to the double deposition of the W films to form islands 37A, 37B and metal portions 38A, 38B of the single sheet W layer.

Since stray light impingement upon control transistor 14 is minimized or eliminated with the novel design of the present invention, control transistor 14 will not malfunction due to the photoelectric effect, and the light intensity falling on LCD-on-silicon device 10 may be increased therefore allowing for increased brightness of the projected image or increased maximum size of the projected image.

While particular embodiments of the present invention have been illustrated and described, it is not intended to limit the invention, except as defined by the following claims.

We claim:

1. A method of fabricating an LCD-on-silicon device, comprising the steps of:
   a) providing a semiconductor structure having a control transistor formed therein; said control transistor having a source and a drain;
   b) providing an interlevel dielectric (ILD) layer over said semiconductor structure;
   c) providing S/D plugs contacting said source and drain through contact openings in said ILD layer;
   d) forming M1 lines over said ILD layer and connected to at least said S/D plugs;
   e) depositing and patterning an M1 intermetal dielectric (IMD) layer over said M1 lines to form M1 contact openings exposing at least some of said M1 metal lines;
   f) forming M1 metal plugs within said M1 contact openings and M2 metal islands connected to at least said M1 metal plugs; said M2 metal islands having exposed side walls;
   g) forming sidewall spacers on said exposed M2 metal islands side walls;
   h) depositing and planarizing an M2 metallization layer over said M2 metal islands to form a shielding layer adjacent to and contiguous with said sidewall spacers; said M2 metal islands, sidewall spacers, and shielding layer forming a light shielding layer;
   i) forming at least one additional dielectric and conductive layer over said light shielding layer and said M1 intermetal dielectric (IMD) layer; and
   j) forming LCD pixels thereover.

2. The method of claim 1, further including the step of:
   forming an optical interface layer over said LCD pixels.

3. The method of claim 1, wherein said light shielding layer prevents most light radiation from passing through said light shielding layer to said control transistor.

4. The method of claim 1, wherein said S/D metal plugs, M1 metal lines, and additional conductive layers are comprised of a first metal selected from the group aluminum, titanium, tungsten and an aluminum copper alloy; and said M1 metal plugs, M2 metal islands, and M2 metallization layer are comprised of a second metal selected from the group titanium, titanium nitride, and tungsten.

5. The method of claim 1, wherein the bases of said sidewall spacers are from about 0.05 to 0.2 μm wide.

6. The method of claim 1, wherein the bases of said sidewall spacers are about 0.1 μm wide.

7. The method of claim 1, wherein ILD and IMD layers are from about 0.3 to 2 μm thick.

8. The method of claim 1, further including the step of:
   forming a optical interface layer over said LCD pixels; wherein said optical interface layer is comprised of at least one passivation layer formed of a material selected from the group comprising $SiO_2$ and $Si_3N_4$.

9. The method of claim 1 wherein said sidewall spacers are comprised of a material selected from the group comprising black dielectric and $SiO_2$.

10. The method of claim 1, wherein at least one of said M1 IMD layer and said at least one additional IMD layer is comprised of a material selected from the group comprising black dielectric, $Si_3N_4$, $SiO_2$ organic polymers, and low dielectric constant (K) materials with or without the addition of dye to absorb light.

11. A method of fabricating an LCD-on-silicon device, comprising the steps of:
   a) providing a semiconductor structure having a control transistor formed therein; said control transistor having a source and a drain;
   b) depositing and patterning an interlevel dielectric (ILD) layer over said semiconductor structure to form S/D contact openings exposing said control transistor source and drain, respectively;
   c) forming S/D plugs within said S/D contact openings;
   d) forming M1 AlCu lines over said ILD layer and connected to at least said S/D AlCu plugs;
   e) depositing and patterning an M1 intermetal dielectric (IMD) layer over said M1 AlCu lines to form M1 contact openings exposing at least some of said M1 AlCu lines;
   f) depositing, etching and planarizing a first M2 W metallization layer over said M1 IMD layer, filling said M1 contact openings, and forming M1 W plugs within said M1 contact openings;
   g) forming M2 W islands connected to at least said M1 W plugs; said M2 W islands having exposed side walls;
   h) forming sidewall spacers on said exposed M2 W island side walls;
   i) depositing and planarizing a second M2 W metallization layer over said M2 W islands to form M2 W lines adjacent to and contiguous with said sidewall spacers; said M2 W islands, sidewall spacers, and M2 W lines forming a light shielding layer;

j) depositing and patterning at least one additional IMD layer over said light shielding layer to form light shielding layer contact openings exposing at least some of said light shielding layer metal islands and lines;

k) forming light shielding layer AlCu plugs in said light shielding layer contact openings;

l) forming AlCu pixels electrodes over said at least one additional IMD layer connected to said light shielding layer AlCu plugs; and m) forming an optical interface layer over said pixel electrodes.

12. The method of claim 11, wherein said light shielding layer prevents most light radiation from passing through said light shielding layer to said control transistor.

13. The method of claim 11, wherein the bases of said sidewall spacers are from about 0.05 to 0.2 $\mu$m wide.

14. The method of claim 11, wherein the bases of said sidewall spacers are about 0.1 $\mu$m wide.

15. The method of claim 11, wherein ILD and IMD layers are from about 0.3 to 2 $\mu$m thick.

16. The method of claim 11 wherein said optical interface layer is comprised of at least one passivation layer formed of a material selected from the group comprising $SiO_2$ and $Si_3N_4$.

17. The method of claim 11 wherein said sidewall spacers are comprised of a material selected from the group comprising black dielectric and $SiO_2$.

18. The method of claim 11, wherein at least one of said M1 IMD layer and said at least one additional IMD layer is comprised of a material selected from the group comprising black dielectric, $Si_3N_4$, $SiO_2$ organic polymers, and low dielectric constant (K) materials with or without the addition of dye to absorb light.

19. A method of fabricating an LCD-on-silicon device, comprising the steps of:

a) providing a semiconductor structure having a control transistor formed therein; said control transistor having a source and a drain;

b) depositing and patterning an interlevel dielectric (ILD) layer over said semiconductor structure to form S/D contact openings exposing said control transistor source and drain, respectively;

c) forming S/D plugs within said S/D contact openings;

d) forming M1 AlCu lines over said ILD layer and connected to at least said S/D AlCu plugs;

e) depositing and patterning an M1 intermetal dielectric (IMD) layer over said M1 AlCu lines to form M1 contact openings exposing at least some of said M1 AlCu lines;

f) depositing, etching and planarizing a first M2 W metallization layer over said M1 IMD layer, filling said M1 contact openings, and forming M1 W plugs within said M1 contact openings;

g) depositing, etching and planarizing a second M2 W metallization layer over said M1 IMD layer and said M1 W plugs to form M2 W islands connected to at least said M1 W plugs; said M2 W islands having exposed side walls;

h) forming sidewall spacers on said exposed M2 W island side walls; wherein the bases of said sidewall spacers are from about 0.05 to 0.2 $\mu$m;

i) depositing and planarizing a second M2 W metallization layer over said M2 W islands to form M2 W lines adjacent to and contiguous with said sidewall spacers; said M2 W islands, sidewall spacers, and M2 W lines forming a light shielding layer;

j) depositing and patterning at least one additional IMD layer over said light shielding layer to form light shielding layer contact openings exposing at least some of said light shielding layer metal islands or lines;

k) forming light shielding layer AlCu plugs in said light shielding layer contact openings;

l) forming AlCu pixels electrodes over said at least one additional IMD layer connected to said light shielding layer AlCu plugs; and m) forming an optical interface layer over said pixel electrodes;

wherein said light shielding layer prevents most light radiation from passing through said light shielding layer to said control transistor.

20. The method of claim 19, wherein the bases of said sidewall spacers are about 0.1 $\mu$m wide.

21. The method of claim 19, wherein ILD and IMD layers are from about 0.3 to 2 $\mu$m thick.

22. The method of claim 19 wherein said optical interface layer is comprised of at least one passivation layer formed of a material selected from the group comprising $SiO_2$ and $Si_3N_4$.

23. The method of claim 19 wherein said sidewall spacers are comprised of a material selected from the group comprising black dielectric and $SiO_2$.

24. The method of claim 19, wherein at least one of said M1 IMD layer and said at least one additional IMD layer is comprised of a material selected from the group comprising black dielectric, $Si_3N_4$, $SiO_2$ organic polymers, and low dielectric constant (K) materials with or without the addition of dye to absorb light.

* * * * *